(12) United States Patent
Lee et al.

(10) Patent No.: US 7,115,914 B2
(45) Date of Patent: Oct. 3, 2006

(54) NITRIDE SEMICONDUCTOR LIGHT-EMITTING DEVICE

(75) Inventors: Jae Hoon Lee, Kyungki-do (KR); Yong Chun Kim, Kyungki-do (KR); Je Won Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 10/944,745

(22) Filed: Sep. 21, 2004

(65) Prior Publication Data

US 2005/0263783 A1 Dec. 1, 2005

(30) Foreign Application Priority Data

May 31, 2004 (KR) ............. 10-2004-0039101

(51) Int. Cl.
*H01L 33/00* (2006.01)
(52) U.S. Cl. .................. 257/96; 257/102; 257/103
(58) Field of Classification Search .......... 257/96–103, 257/79, 13, 21, 44–45
See application file for complete search history.

(56) References Cited

U.S. PATENT DOCUMENTS

| 5,290,393 A | 3/1994 | Nakamura | |
|---|---|---|---|
| 2002/0179923 A1* | 12/2002 | Morita et al. | 257/103 |
| 2002/0195054 A1* | 12/2002 | Harafuji et al. | 118/715 |

FOREIGN PATENT DOCUMENTS

| JP | 2001-237457 | 8/2001 |
|---|---|---|
| KR | 2003-83011 | 10/2003 |
| WO | 03/103062 | 12/2003 |

\* cited by examiner

*Primary Examiner*—Cuong Nguyen
(74) *Attorney, Agent, or Firm*—Lowe Hauptman & Berner, LLP.

(57) ABSTRACT

A nitride semiconductor light-emitting device includes a first conductive nitride semiconductor layer; an active layer formed on the first conductive nitride semiconductor layer, and having at least one quantum well layer and at least one quantum barrier layer alternatively laminated; and a second conductive nitride semiconductor layer formed on the active layer, wherein at least one of the quantum well layer and quantum barrier layer in the active layer is doped with elemental Al in a concentration of less than 1%.

16 Claims, 6 Drawing Sheets

NITRIDE SEMICONDUCTOR LIGHT-EMITTING DEVICE

RELATED APPLICATIONS

The present application is based on, and claims priority from, Korean Application Serial Number 2004-39101, filed May 31, 2004, the disclosure of which is hereby incorporated by reference herein in its entirety.

BACKGROUND OF THE INVENTION

1. Field of the Invention

The present invention relates to a nitride semiconductor light-emitting device, and more particularly to a nitride semiconductor light-emitting device having improved electrical and optical characteristics by improving crystallinity of an active layer.

2. Description of the Related Art

Recently, advent of a nitride semiconductor capable of emitting a blue-green light has lead to realization of three primary colors and white light in semiconductor light-emitting devices. Therefore, application areas of light-emitting devices made of such a nitride semiconductor are further extended and thus widely used in lightings in which high-directivity is required, such as back light sources of key pads and liquid crystal displays, traffic lights, guide lights of runways, and the like.

Generally, as a nitride semiconductor, semiconductor crystalline material having the formula of $Al_xIn_yGa_{(1-x-y)}N$ wherein x is a number between 0 and 1, y is a number between 0 and 1, and the sum of x and y is a number between 0 and 1, is used. However, there in no commercially available substrate having the same crystal structure as that of the nitride semiconductor while exhibiting lattice matching therebetween, and thus a sapphire substrate, which is electrically insulative, is primarily used.

Consequently, there are crystal defects resulting from difference in a lattice constant and thermal expansion coefficient between the sapphire substrate and the nitride semiconductor layer grown thereon. In order to lower this problem, a buffer layer may be used on the sapphire substrate, but the buffer layer alone cannot completely resolve such a problem associated with crystal defects. In particular, in InGaN/GaN layer used as an active layer for generating/emitting a blue-green light, these crystal defects raise a problem of greatly reducing a light-gain.

In order to overcome such a problem of light-gain deterioration occurred in the active layer composed of InGaN/GaN, a conventional art has increased a carrier concentration by doping the active layer with a predetermined concentration of elemental Si or Ge. Generally, the active layer has a structure having a quantum barrier layer composed of undoped AlGaN or GaN and a quantum well layer composed of undoped InGaN alternatively laminated. At least one layer among them was doped with Si or Ge in a relatively high concentration, for example above $10^{17}/cm^3$, to increase the carrier concentration. In particular, where the active layer has a multiple quantum well structure, the layer is relatively thicker compared to a single quantum well structure, thereby increasing series resistance, in turn increasing a driving voltage and therefore has significantly deteriorated electrical and optical characteristics thus requiring higher doping concentration.

As described above, the scheme of Si or Ge doping necessarily requires an excessive amount of impurities doping, in order to effectively increase the light-gain and thus may present a factor causing crystallinity deterioration. Further, due to a band-tail phenomenon, an oscillating light shifts to a long wavelength region and thus it is difficult to design a light-emitting device with a desired short wavelength.

For these reasons, there remains a need for improving the active layer capable of providing an effect of increasing carrier concentration while reducing crystal defects in the related art.

SUMMARY OF THE INVENTION

Therefore, the present invention has been made in view of the above problems, and it is an object of the present invention to provide a nitride semiconductor light-emitting device having an active layer doped with a small amount of Al, a group III element of the periodic table, in order to reduce a carrier capture effect due to crystal defects and thus substantially increase an effective amount of carrier.

It is another object of the present invention to provide a process for preparing the nitride semiconductor light-emitting device as described above.

In accordance with the present invention, the above and other objects can be accomplished by the provision of a nitride semiconductor light-emitting device comprising:

a first conductive nitride semiconductor layer;

an active layer formed on the first conductive nitride semiconductor layer, and having at least one quantum well layer and at least one quantum barrier layer alternatively laminated; and a second conductive nitride semiconductor layer formed on the active layer, wherein at least one of the quantum well layer and quantum barrier layer in the active layer is doped with elemental Al in a concentration of less than 1%.

Preferably, a doping amount of elemental Al in the above-mentioned at least one layer may range from 0.2 to 0.6%.

In one embodiment of the present invention, the quantum barrier layer may be composed of material having the formula of $In_{x1}Ga_{1-x1}N$ wherein $x_1$ is a number between 0 and 1, and the quantum well layer may be composed of material having the formula of $In_{x2}Ga_{1-x2}N$ wherein $x_2$ is a number between 0 and 1, having an energy band gap smaller than that of the quantum barrier layer.

In specific embodiment of the present invention, the active layer may have a multiple quantum well structure composed of a plurality of quantum barrier layers and a plurality of quantum well layers. In this embodiment, all the quantum barrier layers in the active layer may be doped with elemental Al in a concentration of less than 1%. Alternatively, all the quantum well layers in the active layer may be doped with elemental Al in a concentration of less than 1%. Further, the entire active layer, that is all the quantum barrier layers and quantum well layers may be doped with elemental Al.

In accordance with the present invention, a small amount of Al incorporation into the active layer decreases the density of the compensation acceptors by the substitution of Al atoms for Ga vacancy sites. It is well known that a Ga vacancy has a deep acceptor state and thus acts as a compensating center, which decreases the free electron concentration in an n-type GaN material. Thus, the active layer doped with a small amount of Al has improved crystallinity and also increased concentration of carrier.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
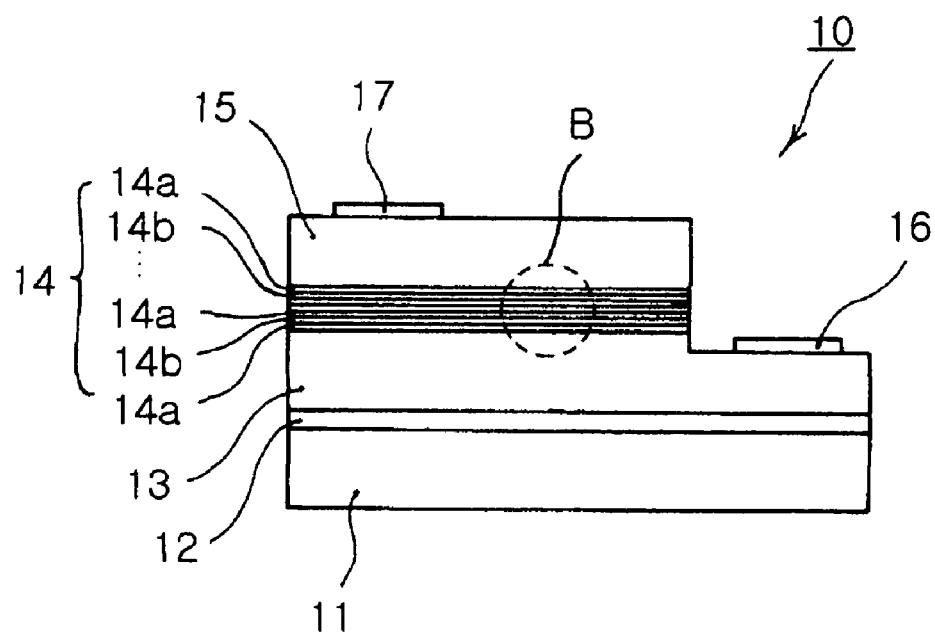
FIGS. 1a and 1b are, respectively, a cross-sectional side view and a partial detail view showing a structure of a semiconductor light-emitting device in accordance with the present invention.

Now, the present invention will be described in detail with reference to the attached drawings. FIG. 1a shows a structure of a nitride semiconductor light-emitting device in accordance with the present invention.

Referring to FIG. 1a, a nitride semiconductor light-emitting device 10 includes a first nitride semiconductor layer 13, an active layer 14 and a second nitride semiconductor layer 15, sequentially formed on a sapphire substrate 11. A buffer layer 12 may be further formed on the sapphire substrate 11 to provide for lattice matching therebetween. Further, a first electrode 16 is formed on the upper surface of the mesa etched first nitride semiconductor layer 13 while a second electrode 17 is formed on the upper surface of the second nitride semiconductor layer 15.

Figure 1B:
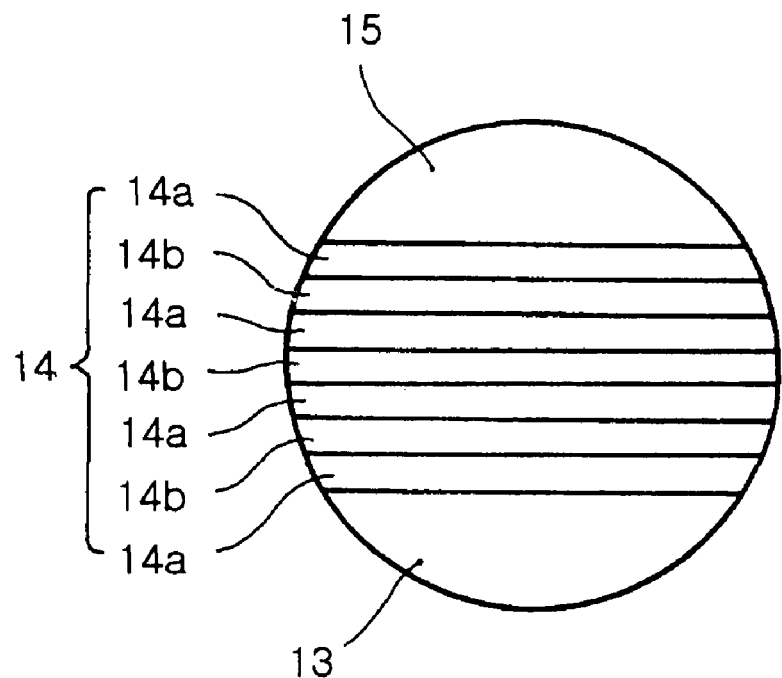

The active layer 14 is composed of a quantum barrier layer 14a of material having the formula of $In_{x1}Ga_{1-x1}N$ wherein $x_1$ is a number between 0 and 1, and a quantum well layer 14b of material having the formula of $In_{x2}Ga_{1-x2}N$ wherein $x_2$ is a number between 0 and 1, having an energy band gap smaller than that of the quantum barrier layer 14a. The active layer 14 may take a multiple quantum well structure having a plurality of quantum barrier layer 14a and a plurality of quantum well layer 14b laminated alternatively, as shown in FIG. 1b.

At least a portion of the active layer 14 used in the present invention is doped with elemental Al to a concentration of less than 1%, and thereby a gallium vacancy present in a GaN layer or InGaN layer is passivated, resulting in inhibiting growth thereof as dislocation leading to improvement of crystallinity and further allowing captured electrons to be freed, thus increasing carrier concentration. Preferably, when growing the quantum well layer 14b where recombination occurs, it may be doped with Al of less than 1% concentration to effectively improve crystallinity and light-gain of the active layer, but the quantum barrier layer 14a may also be doped with Al of less than 1% concentration to obtain similar effect. Where Al is doped above 1%, it may rather aggravate crystallinity, as shown in conventional cases that Si or Ge, a Group IV element, is doped, and therefore a doping amount of Al in accordance with the present invention is restricted to less than 1%.

In the present invention, Al doping may be easily performed by appropriately controlling an amount of trimethylaluminum (TMAl) when GaN or InGaN crystals are growing, with MOCVD (Metal Organic Chemical Vapor Deposition).

Figure 2:
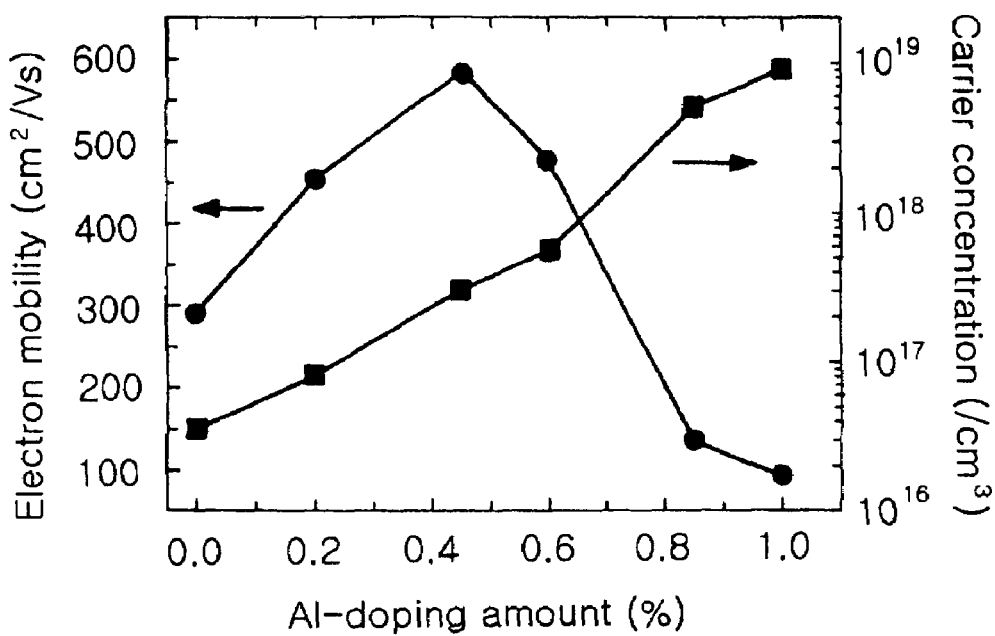
FIG. 2 is a graph showing changes in electron mobility and carrier concentration with variation of an Al-doped amount in accordance with the present invention.

FIG. 2 is a graph showing changes in electron mobility and carrier concentration with variation of Al content in GaN in accordance with the present invention.

Referring to FIG. 2, it can be seen that carrier concentration increases as Al content increases up to 1%. In addition, as regards electron mobility, it is 450 cm$^2$/Vs at Al content of from 0.2 to 0.6%, and particularly, the highest electron mobility (about 600 cm$^2$/Vs) when Al content is 0.45%. In this case, doping concentration is confirmed as $3\times10^{17}$/cm$^3$. Therefore, doping of GaN with a small amount of Al decreases a defect such as Ga vacancy which captures electrons, and thereby improvement of crystallinity of the active layer and at the same time, increase of free carrier concentration can be obtained, thus improving electrical and optical characteristics. Considering increase of the electron mobility and free carrier concentration, a doping amount of Al is preferably from about 0.2 to 0.6%, and more preferably about 0.45%.

Figure 3:
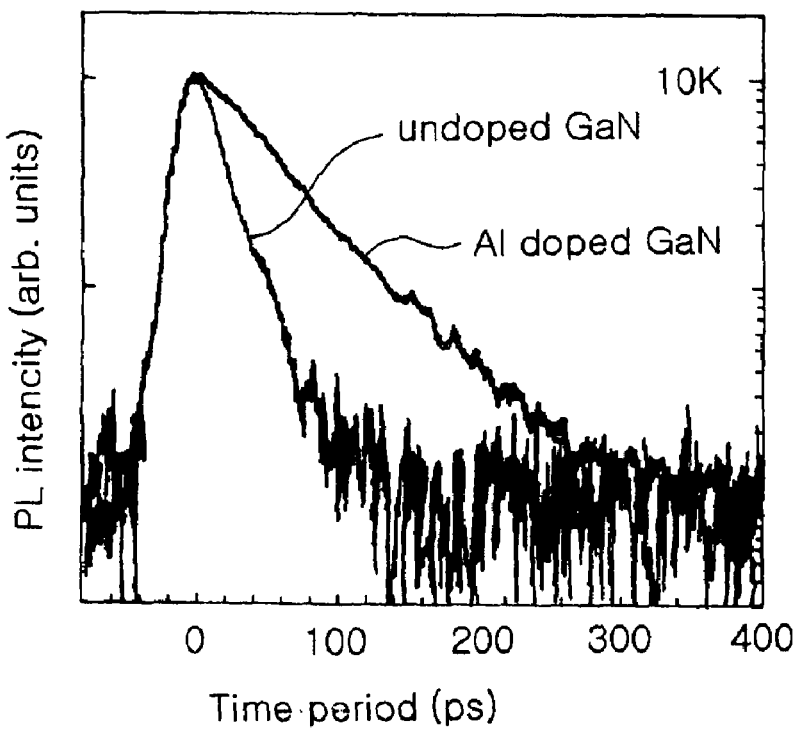
FIG. 3 is a graph showing changes in intensity of photoluminescence (PL) of an undoped GaN and Al-doped GaN with time period.

FIG. 3 is a graph showing changes in intensity of photoluminescence (PL) of an undoped GaN and Al-doped GaN with time period.

Referring to FIG. 3, changes in intensity of photoluminescence (PL) of an undoped GaN sample and a GaN sample doped with 0.45% of Al with time period are shown. In case of the undoped GaN sample used as a conventional active layer, a band-edge emission decay time was less than 20 ps while the Al-doped GaN sample used as the active layer in the present invention exhibited the band-edge emission decay time increased up to 58 ps. This result demonstrates that doping of GaN with Al decreases a recombination center. Therefore, where the Al-doped GaN or InGaN in accordance with the present invention is used in the quantum well layer of the active layer, the light-gain can be significantly improved.

Figure 4A:
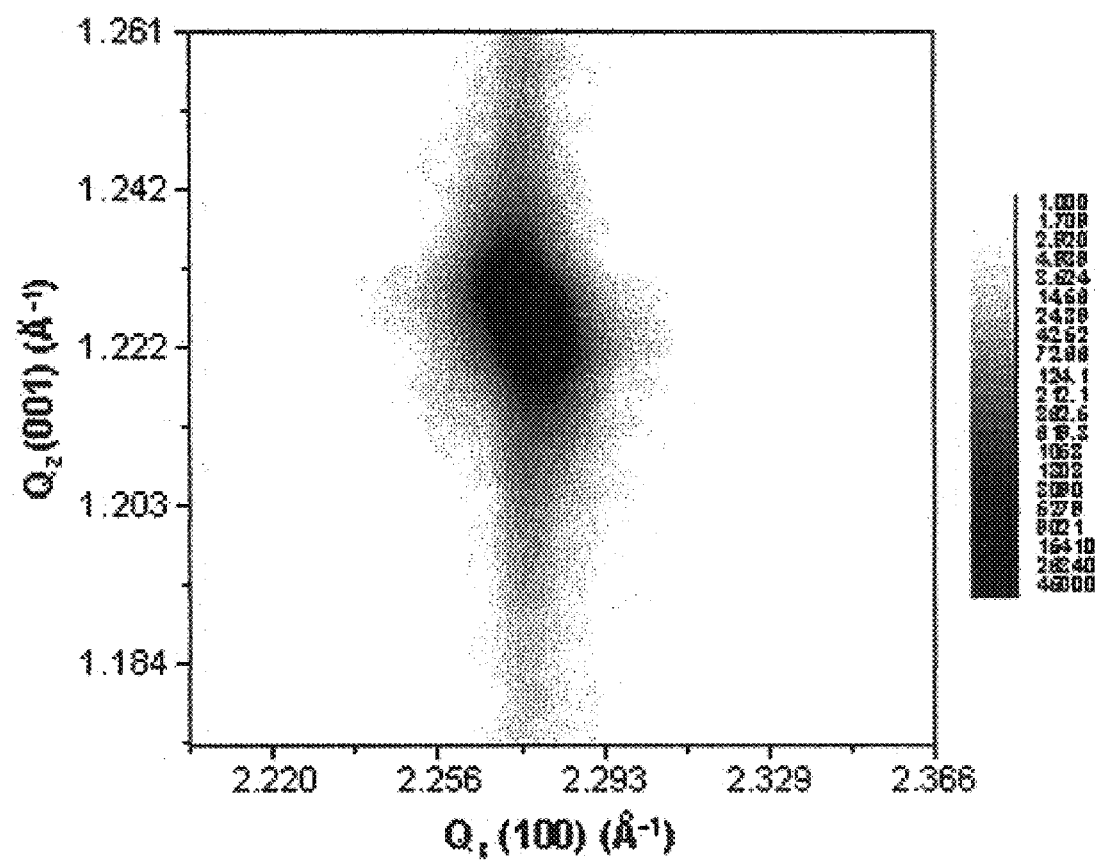
FIGS. 4a and 4b show scattering intensity distributions of asymmetrical reciprocal lattice spaces for an undoped GaN and Al-doped GaN, respectively.
Figure 4B:
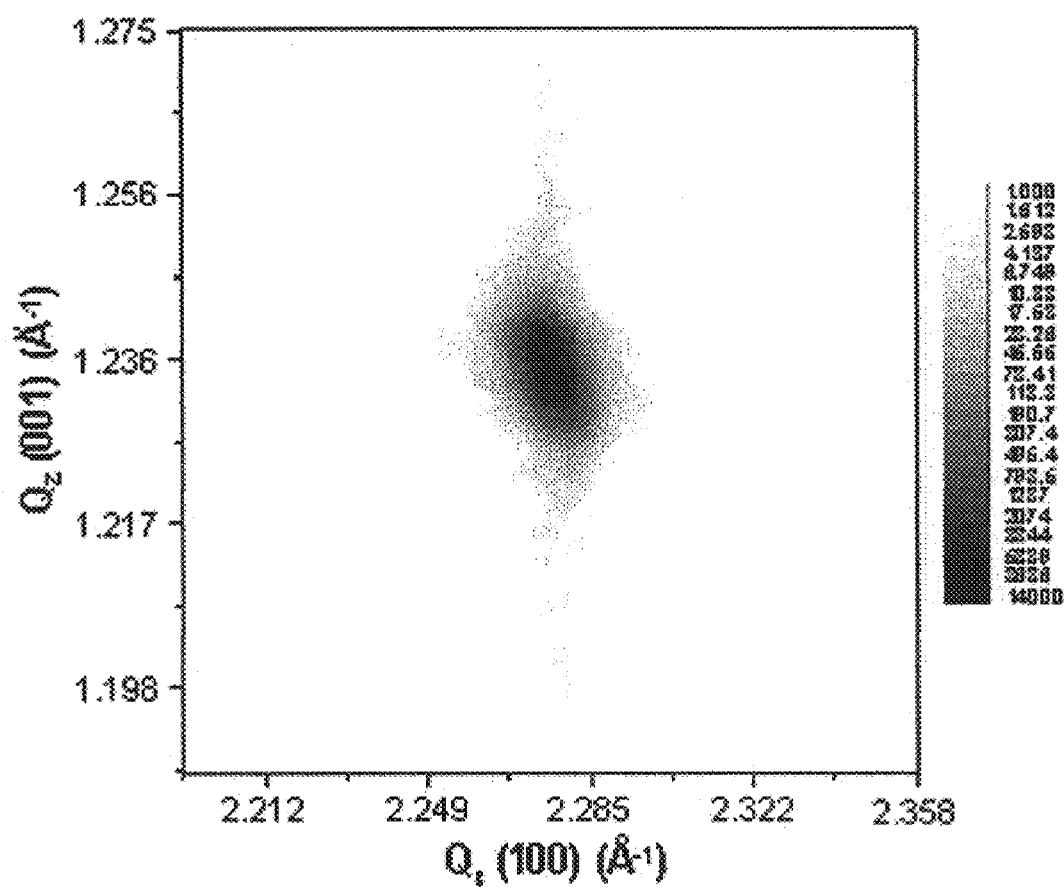

FIGS. 4a and 4b shows, respectively, scattering intensity distribution of an asymmetrical reciprocal lattice space for an undoped GaN and Al-doped GaN.

More specifically, in order to confirm improvement of crystallinity due to Al-doping, FIGS. 4a and 4b shows the results in which the scattering intensity distribution of an asymmetrical reciprocal lattice space in crystal direction 101, was measured, for the undoped GaN sample and the Al-doped GaN sample containing 0.45% of Al. The above-mentioned distribution appears due to thermal vibration and defects or structural randomness and contains information of crystal structure. Here, the Qx axis is an axis relating to a rocking curve of the disqualified, and the Qz axis is an axis representing a distance between faces in a real space, "d".

Comparing FIG. 4a with FIG. 4b, the Al-doped GaN sample has a narrower width appearing at the Qx axis compared to the undoped GaN sample, while the undoped GaN sample has a broad distribution in the form of a loop, around a reciprocal lattice at the Qz axis. Particularly, it can be seen that the Al-doped GaN sample has a symmetrically narrower scattering distribution of the Qz axis in the vertical direction compared to a thin film of the undoped GaN. These results, as described above, confirmed that passivation of Ga vacancy by Al-doping substantially reduced defects thereof.

Figure 5A:
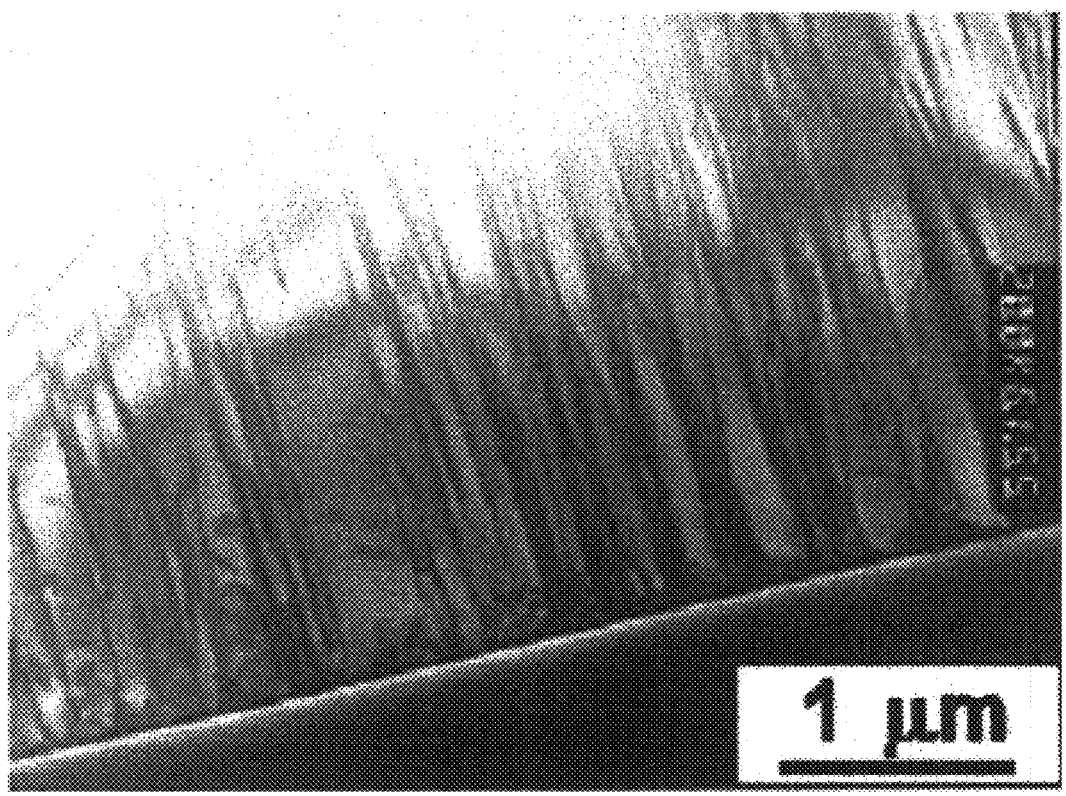
FIGS. 5a and 5b are, respectively, TEM micrographs of an undoped GaN and Al-doped GaN.
Figure 5B:
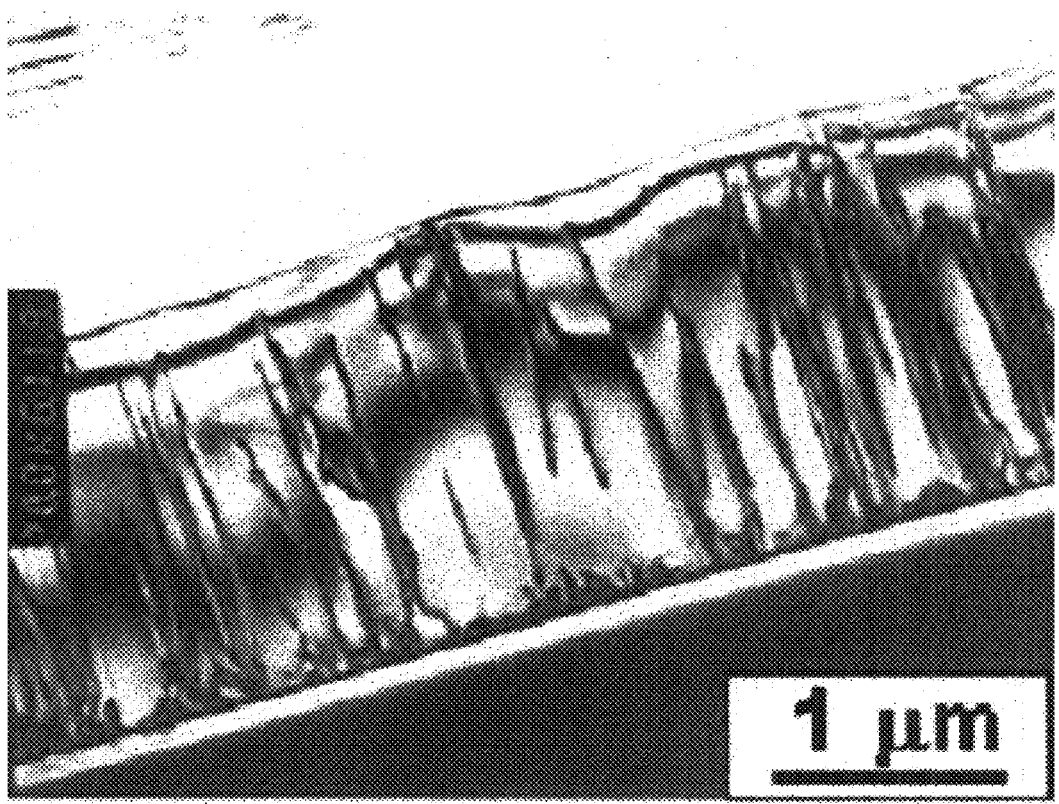

FIGS. 5a and 5b are, respectively, TEM micrographs of an undoped GaN and Al-doped GaN. These TEM micrographs show TEM micrographs in the direction 0002 for the undoped GaN sample and the Al-doped GaN sample containing 0.45% of Al.

Referring to FIGS. 5a and 5b, a screw threading dislocation occurring in the undoped GaN sample and Al-doped GaN sample can be confirmed. Comparison of FIG. 5a and FIG. 5b confirmed that the dislocation density of the undoped GaN is about $10^{11}/cm^2$, while the dislocation occurring in the Al-doped GaN was significantly reduced to a level of about $10^9/cm^2$. As described above, these results are because the doped Al passivates Ga vacancy in the Al-doped GaN and thus inhibits growth thereof as two- or three-dimensional dislocation. As can be confirmed from FIGS. 4a and 4b through these results, the crystallinity of Al-doped GaN was greatly improved.

As apparent from the above description, the present invention provides a nitride semiconductor light-emitting device having excellent electrical and optical characteristics by doping a GaN based active layer (particularly, quantum well layer) with Al to a content of less than 1% so as to improve crystallinity thereof and at the same time, increase free carrier concentration.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A nitride semiconductor light-emitting device, comprising:
    a first conductive nitride semiconductor layer;
    an active layer formed on the first conductive nitride semiconductor layer, and having at least one quantum well layer and at least one quantum barrier layer alternatively laminated; and
    a second conductive nitride semiconductor layer formed on the active layer,
    wherein
    at least one of the quantum well layer and quantum barrier layer in the active layer is doped with elemental Al in a concentration that ranges from 0.2 to 0.6%.

2. The nitride semiconductor light-emitting device as set forth in claim 1, wherein the active layer has a multiple quantum well structure composed of a plurality of quantum barrier layers and a plurality of quantum well layers.

3. The nitride semiconductor light-emitting device as set forth in claim 2, wherein all the quantum barrier layers in the active layer are doped with elemental Al in a concentration that ranges from 0.2 to 0.6%.

4. The nitride semiconductor light-emitting device as set forth in claim 2, wherein all the quantum well layers in the active layer are doped with elemental Al in a concentration that ranges from 0.2 to 0.6%.

5. The nitride semiconductor light-emitting device as set forth in claim 1, wherein
    the quantum barrier layer is composed of material having the formula of $In_{x1}Ga_{1-x1}N$, where x1 is a number between 0 and 1; and
    the quantum well layer is composed of material having the formula of $In_{x2}Ga_{1-x2}N$, where x2 is a number between 0 and 1, and having an energy band gap smaller than that of the quantum barrier layer.

6. A nitride semiconductor light-emitting device, comprising:
    a first conductive nitride semiconductor layer;
    an active layer formed on the first conductive nitride semiconductor layer, and having at least one quantum well layer and at least one quantum barrier layer alternatively laminated; and
    a second conductive nitride semiconductor layer formed on the active layer,
    wherein
    at least one of the quantum well layer and quantum barrier layer in the active layer is doped with elemental Al in a concentration of less than 1%;
    the quantum barrier layer is composed of material having the formula of $In_{x1}Ga_{1-x1}N$, where x1 is a number between 0 and 1; and
    the quantum well layer is composed of material having the formula of $In_{x2}Ga_{1-x2}N$, where x2 is a number between 0 and 1, and having an energy band gap smaller than that of the quantum barrier layer.

7. A nitride semiconductor light-emitting device, comprising:
    a first conductive nitride semiconductor layer;
    an active layer formed on the first conductive nitride semiconductor layer; and
    a second conductive nitride semiconductor layer formed on the active layer,
    wherein
    said active layer comprises at least one quantum well layer and at least one quantum barrier layer laminated with said at least one quantum well layer; and
    at least one of the quantum well layer and quantum barrier layer in the active layer is doped with Al and contains Al dopants in a concentration of higher than 0% and less than 1%.

8. The nitride semiconductor light-emitting device as set forth in claim 7, wherein said concentration ranges from 0.2 to 0.6%.

9. The nitride semiconductor light-emitting device as set forth in claim 7, wherein
    the quantum barrier layer is made of $In_{x1}Ga_{1-x1}N$, where x1 is a number between 0 and 1; and
    the quantum well layer is made of $In_{x2}Ga_{1-x2}N$, where x2 is a number between 0 and 1, and has an energy band gap smaller than that of the quantum barrier layer.

10. The nitride semiconductor light-emitting device as set forth in claim 7, wherein the active layer has a multiple quantum well structure comprising a plurality of quantum barrier layers and a plurality of quantum well layers, and wherein said quantum baffler layers and said quantum well layers are alternatingly laminated to define said active layer.

11. The nitride semiconductor light-emitting device as set forth in claim 10, wherein all the quantum barrier layers in the active layer are doped with Al, and each of said quantum barrier layers contains Al dopants in a concentration of higher than 0% and less than 1%.

12. The nitride semiconductor light-emitting device as set forth in claim 10, wherein all the quantum well layers in the active layer are doped with Al, and each of said quantum well layers contains Al dopants in a concentration of higher than 0% and less than 1%.

13. The nitride semiconductor light-emitting device as set forth in claim 8, wherein
    the quantum barrier layer is made of $In_{x1}Ga_{1-x1}N$, where x1 is a number between 0 and 1; and the quantum well layer is made of $In_{x2}Ga_{1-x2}N$, where x2 is a number between 0 and 1, and has an energy band gap smaller than that of the quantum barrier layer.

14. The nitride semiconductor light-emitting device as set forth in claim 8, wherein the active layer has a multiple quantum well structure comprising a plurality of quantum barrier layers and a plurality of quantum well layers, and wherein said quantum barrier layers and said quantum well layers are alternatingly laminated to define said active layer.

15. The nitride semiconductor light-emitting device as set forth in claim 14, wherein all the quantum barrier layers in the active layer are doped with Al, and each of said quantum barrier layers contains Al dopants in a concentration that ranges from 0.2 to 0.6%.

16. The nitride semiconductor light-emitting device as set forth in claim 14, wherein all the quantum well layers in the active layer are doped with Al, and each of said quantum well layers contains Al dopants in a concentration that ranges from 0.2 to 0.6%.

* * * * *